United States Patent
Weber et al.

(10) Patent No.: US 10,218,382 B2
(45) Date of Patent: Feb. 26, 2019

(54) DECOMPRESSION USING CASCADED HISTORY WINDOWS

(71) Applicant: Amazon Technologies, Inc., Seattle, WA (US)

(72) Inventors: Ori Weber, Tel-Aviv (IL); Ron Diamant, Albany, CA (US); Yair Sandberg, Holon (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/976,312

(22) Filed: May 10, 2018

(65) Prior Publication Data

US 2018/0375528 A1   Dec. 27, 2018

Related U.S. Application Data

(63) Continuation of application No. 15/633,345, filed on Jun. 26, 2017, now Pat. No. 9,973,205.

(51) Int. Cl.
*H03M 7/34* (2006.01)
*H03M 7/30* (2006.01)
*G06T 9/00* (2006.01)
*G06T 3/40* (2006.01)

(52) U.S. Cl.
CPC ........... *H03M 7/3086* (2013.01); *G06T 9/005* (2013.01); *H03M 7/30* (2013.01); *H03M 7/55* (2013.01); *H03M 7/6064* (2013.01); *G06T 3/40* (2013.01)

(58) Field of Classification Search
CPC .. H03M 7/30; H04N 7/50; H04N 7/30; G06T 3/40

USPC ........................... 341/51; 382/233, 248, 298
See application file for complete search history.

(56) References Cited

U.S. PATENT DOCUMENTS

2004/0126021 A1 *  7/2004  Sull ...................... G11B 27/034
                                                                382/233

OTHER PUBLICATIONS

Feldspar, "An Explanation of the *Deflate* Algorithm," downloaded from http://www.zlib.net/feldspar.html, 5pp. (May 1, 2017).
"History of Lossless Data Compression Algorithms," *Engineering and Technology History Wiki*, downloaded from http://ethw.org/History_of_Lossless_Data_Com-pression_Algorithms#LZ77, 15pp. (accessed May 1, 2017).
"LZ77", downloaded from https://www.cs.helsinki.fi/u/tpkarkka/opetus/12k/dct/-lecture07.pdf, 10pp. (accessed May 1, 2017).
"LZ77 and LZ78", *Wikipedia*, downloaded from https://en.wikipedia.org/wiki/LZ77_and_LZ78#LZ77, 5pp. (accessed May 1, 2017).

* cited by examiner

*Primary Examiner* — Joseph Lauture
(74) *Attorney, Agent, or Firm* — Klarquist Sparkman, LLP

(57) ABSTRACT

The following description is directed to decompression using cascaded history buffers. In one example, an apparatus can include a decompression pipeline configured to decompress compressed data comprising code words that reference a history of decompressed data generated from the compressed data. The apparatus can include a first-level history buffer configured to store a more recent history of the decompressed data received from the decompression pipeline. The apparatus can include a second-level history buffer configured to store a less recent history of the decompressed data received from the first-level history buffer.

20 Claims, 7 Drawing Sheets

DECOMPRESSION USING CASCADED HISTORY WINDOWS

CROSS REFERENCE TO RELATED APPLICATION

This application is a Continuation of U.S. patent application Ser. No. 15/633,345, entitled "Decompression Using Cascaded History Windows", filed Jun. 26, 2017, the entire disclosure of which is incorporated herein by reference in its entirety.

BACKGROUND

Computer systems can process, store, and transfer information to accomplish computing tasks of a user. A computer system may use increased bandwidth when transferring larger amounts of information and may require increased storage resources when storing larger amounts of information. The increased bandwidth and storage requirements can potentially add cost to the computer system. However, bandwidth and storage requirements can potentially be reduced when the information is compressed prior to storing and/or transferring the information. When the information is to be processed, the compressed information can be decompressed to recover the original information. Increasing a speed of decompression can potentially increase overall system performance.

DETAILED DESCRIPTION

Overview

Figure 1:
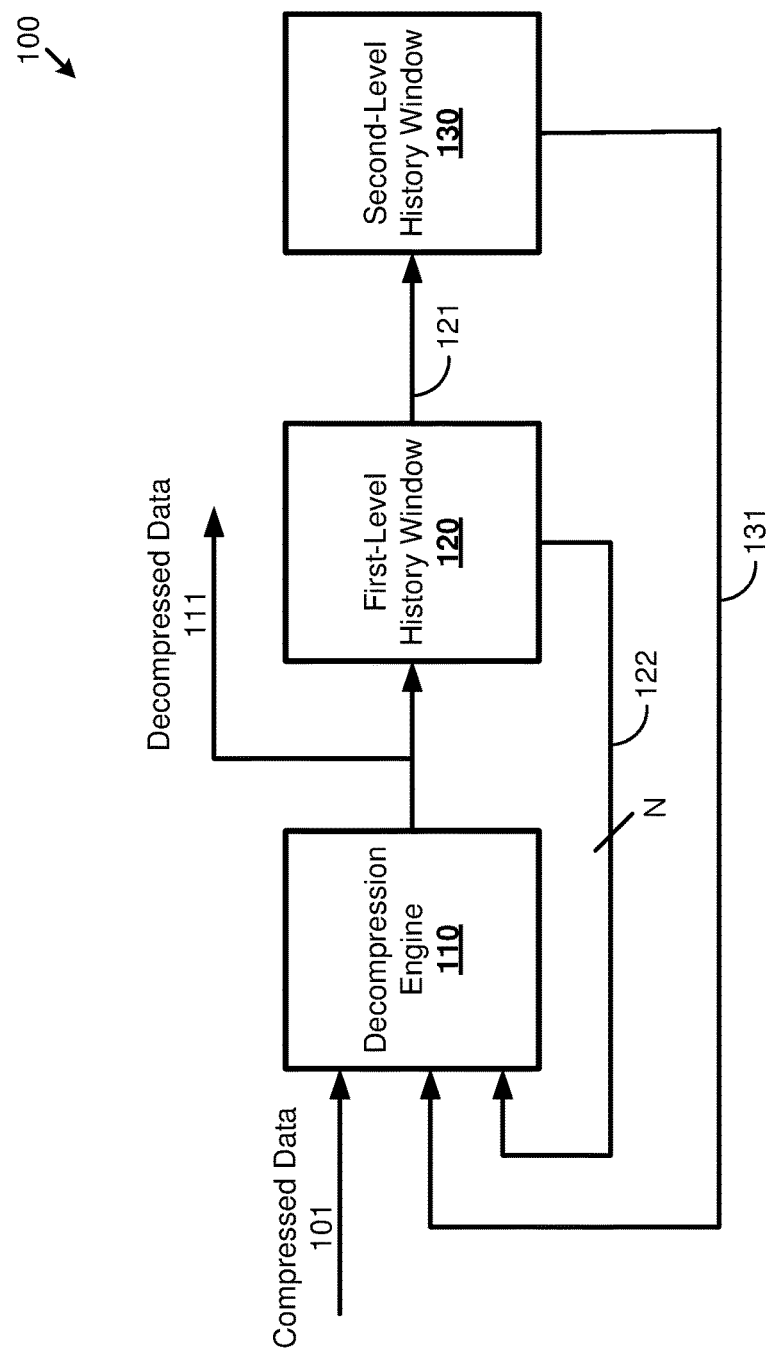
FIG. 1 is a system diagram showing an example of a system for performing decompression using cascaded history windows.

Compressing information before transmission through a network can potentially reduce an amount of bandwidth used for transmitting the information. The reduction in bandwidth can potentially enable more information to be transferred with less networking equipment or with less expensive network equipment. Compressing information before storing it on a storage medium (such as a storage medium within a solid-state drive or a hard-disk drive) can potentially reduce an amount of storage resources used for storing the information. Additionally, the response time of a storage device can be relatively slower than other components of a computing system, and so reducing an amount of information stored within the storage device can potentially increase overall system performance by reducing accesses to the storage device.

Compression algorithms can be categorized in multiple different ways. One category of compression is lossy compression. Lossy compression can be appropriate for information that can be conveyed with various levels of quality. For example, images and audio files may be appropriate for lossy compression methods. Lossy compression can reduce a size of data (such as by removing details that are less important). However, the original information cannot be fully reconstructed from data that was compressed using lossy compression algorithms. Another category of compression is lossless compression. Lossless compression can be appropriate for information that is to be fully reconstructed without errors. For example, computer instructions, financial information, scientific data, and other precise information may be appropriate for lossless compression methods. Additionally, images and audio files can also be compressed using lossless compression algorithms, but the amount of compression may be less than what is achievable using lossy compression algorithms. A lossless compression algorithm is an invertible function, such that a decompression function can fully restore information that was compressed using the lossless compression algorithm.

One class of lossless compression algorithm is a dictionary or substitution coder. A dictionary coder can identify repeated data elements within an uncompressed data stream, and can substitute a smaller encoding for the repeated data elements in a compressed data stream. The process is reversed during decompression so that the substituted data elements in the compressed data stream are replaced with the actual data elements in the decompressed data stream. For example, if the string "ABC" is present multiple times within an uncompressed data stream, the dictionary coder can substitute a reference or pointer to the string "ABC" for some or all of the occurrences of the string "ABC" in the compressed data stream generated from the uncompressed data stream. When the reference to the string "ABC" is smaller than the string "ABC," then the compressed data stream will be smaller than the uncompressed data stream. The corresponding decompression algorithm will replace the reference to the string "ABC" with the string "ABC" so that the original uncompressed data stream can be recovered.

Lempel-Ziv (LZ) compression algorithms are one class of dictionary coders. Specific examples of LZ compression algorithms include LZ77 (also referred to as LZ1), LZ78 (also referred to as LZ2), LZS, LZSS, LZ4, LZO, LZW, and LZMA. An LZ compression algorithm can identify repetitions of sequences within a given history window (also referred to as a sliding window) of a data stream. For example, the given history window can be four kilobytes (kB), eight kB, 16 kB, 32 kB, 64 kB, and so forth. The sequences can be variable length, such as an 8-bit byte, a 16-bit word, a 32-bit word, and so forth. As one example, the LZ compression algorithm can determine a repetitive sequence of maximal length within the given history window. The algorithm can substitute the repeated sequence with code word including a pair specifying a position within the history window and a length of the repeated sequence. Specifically, the position within the history window can be specified as a distance from a beginning of the repeated sequence to a beginning of the latest occurrence of the repeated sequence. As a specific example, the uncompressed data stream "AABCDEFGHIJKLMNAABC123456789" can include the repeated sequence "AABC." An origin of the data stream can begin at the left-most character of the data stream, so that characters toward the left of the stream are earlier in a history (e.g., less recent history) of the stream and characters toward the right of the stream are later in the history (e.g., more recent history) of the stream. Specifically, the characters "DEFG" are earlier in the history than the characters "1234." The beginning of the repeated sequence "AABC" is a distance of 15 characters from the beginning of the original sequence "AABC." The repeated sequence "AABC" can be replaced with the pair (15, 4) indicating that the sequence is four characters long and 15 characters from the original sequence. Thus, the compressed data can be "AABCDEFGHIJKLMN(15,4)123456789." The compressed data can be decompressed by replacing the code word (15, 4) with the original sequence "AABC" so that the original uncompressed data stream can be recovered.

Decompression can be performed by a decompression engine (e.g., a hardware accelerator configured to perform decompression). The decompression engine can be in communication with a buffer that is sized to match the history window used by the LZ compression algorithm. For example, decompressed data output from the decompression engine can be locally cached or stored in the buffer so that the decompression engine can access data within the history window during decompression of a compressed data stream. Due to implementation constraints, as a size of the buffer increases, accessibility of the data within the buffer can decrease. For example, a smaller buffer can potentially enable multiple parallel accesses of data (e.g., via multiple read ports) within the buffer, whereas a larger buffer may only provide a single read access (e.g., via a single read port) of the data. Additionally, an access time of the buffer may increase as the buffer size increases due to a larger distance between circuits of the larger buffers. On the other hand, a larger buffer size can increase compression of a data stream since there may be more opportunities to find repeated sequences.

As described herein, a decompression engine can perform parallelized decompression of a dictionary-coded (e.g., Lempel-Ziv) compressed data stream using a cascaded history buffer. For example, a cascaded history buffer can include a smaller first-level history buffer storing more recent history data and a larger second-level history buffer storing less recent history data. Due to its smaller size, the first-level history buffer can include more read ports than the second-level history buffer. The first-level history buffer having more read ports can provide increased access to data of more recent history compared to the second-level history buffer having fewer read ports for accessing less recent history. Thus, the cascaded history buffer can potentially provide more access to recent history for increased parallelization when decompressing data streams that exhibit temporal locality within the history window. Additionally, the second-level history buffer can provide more storage than the first-level history buffer alone and so compression can potentially be increased due to the additional likelihood of the presence of repetitive sequences within the larger history window.

Example Architectures for Decompression Using Cascaded History Windows

Figure 2:
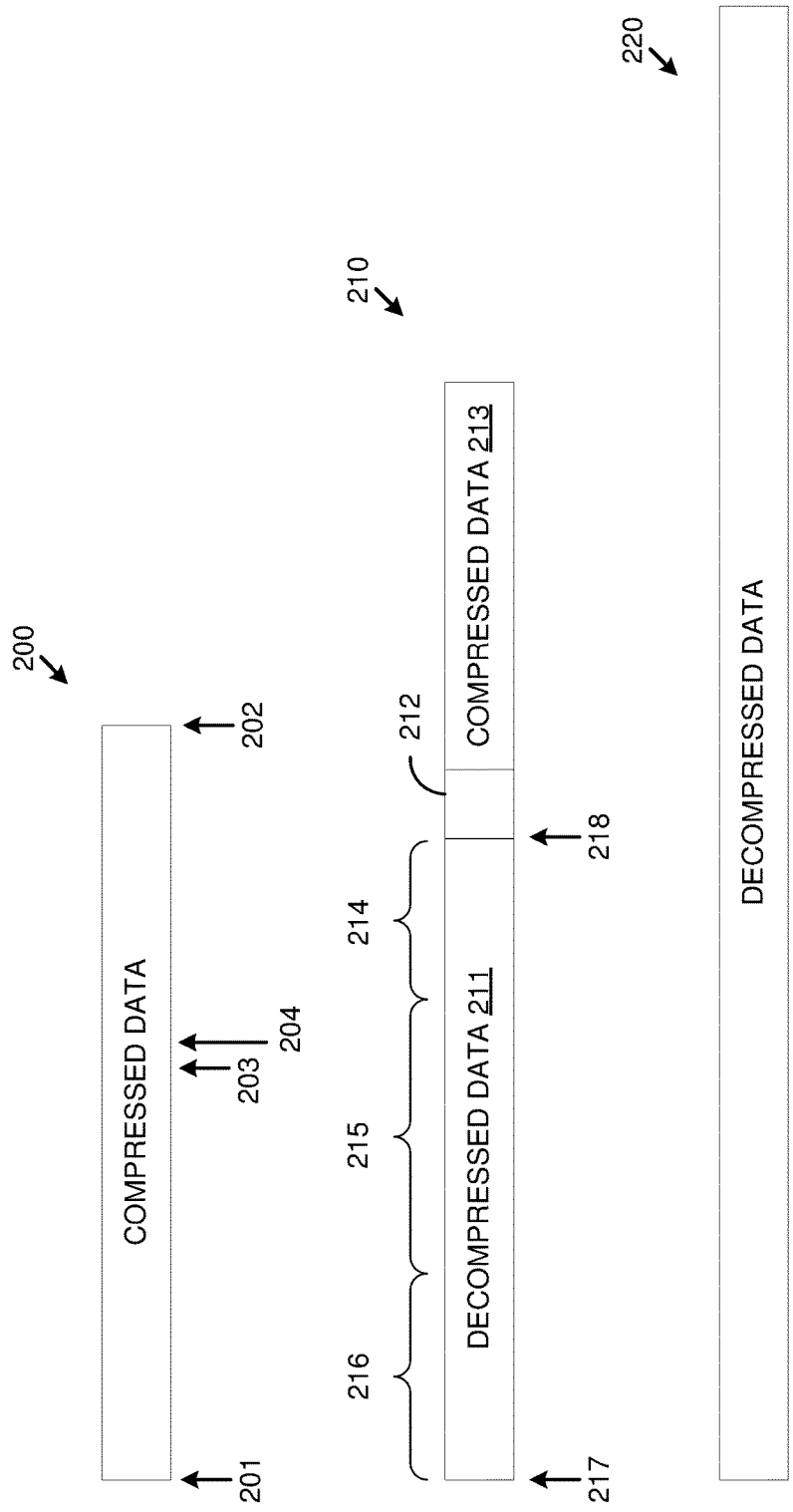
FIG. 2 illustrates an example of decompressing information using cascaded history windows.
Figure 3:
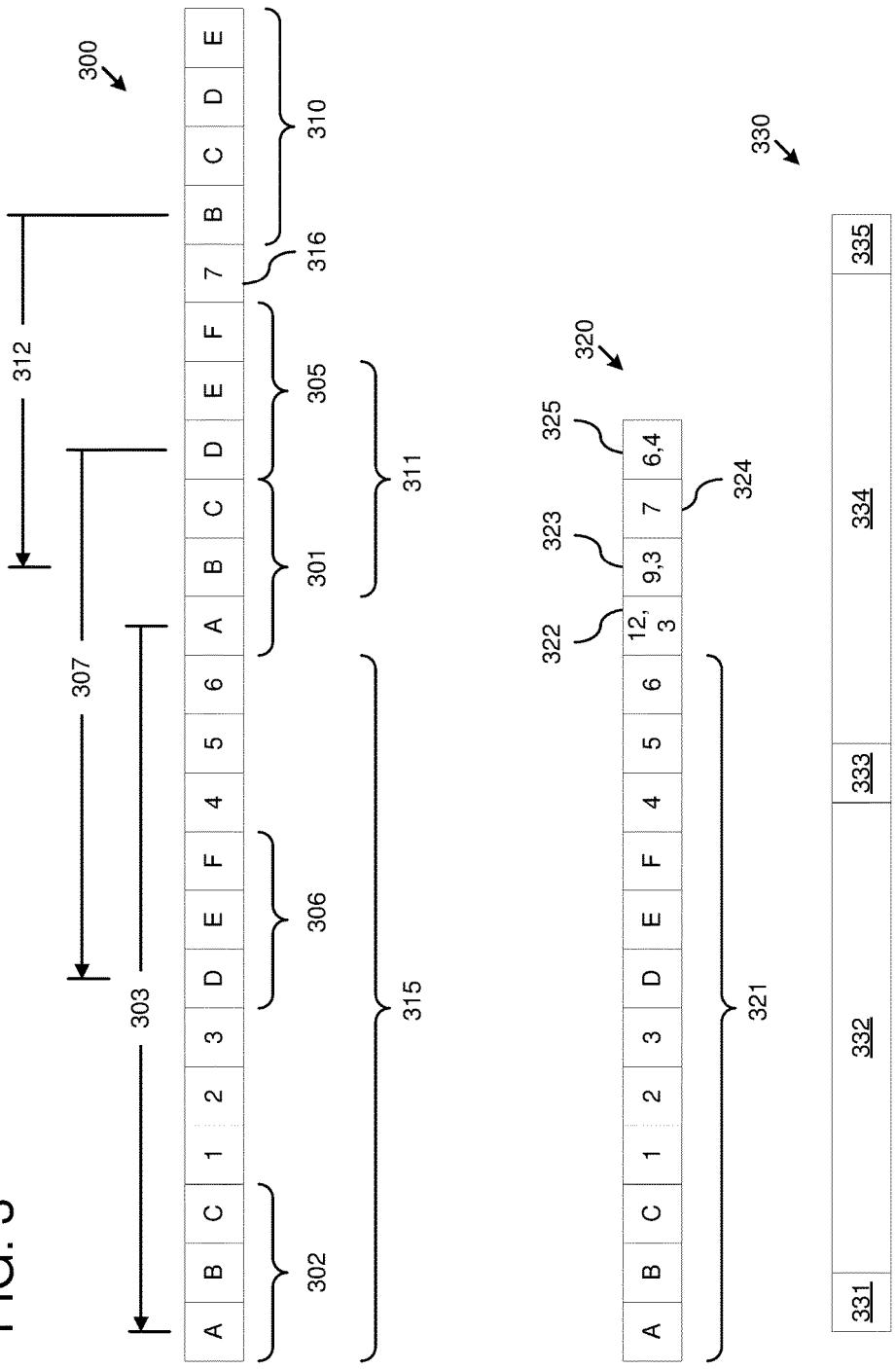
FIG. 3 illustrates an example of compressed and decompressed information.
Figure 4:
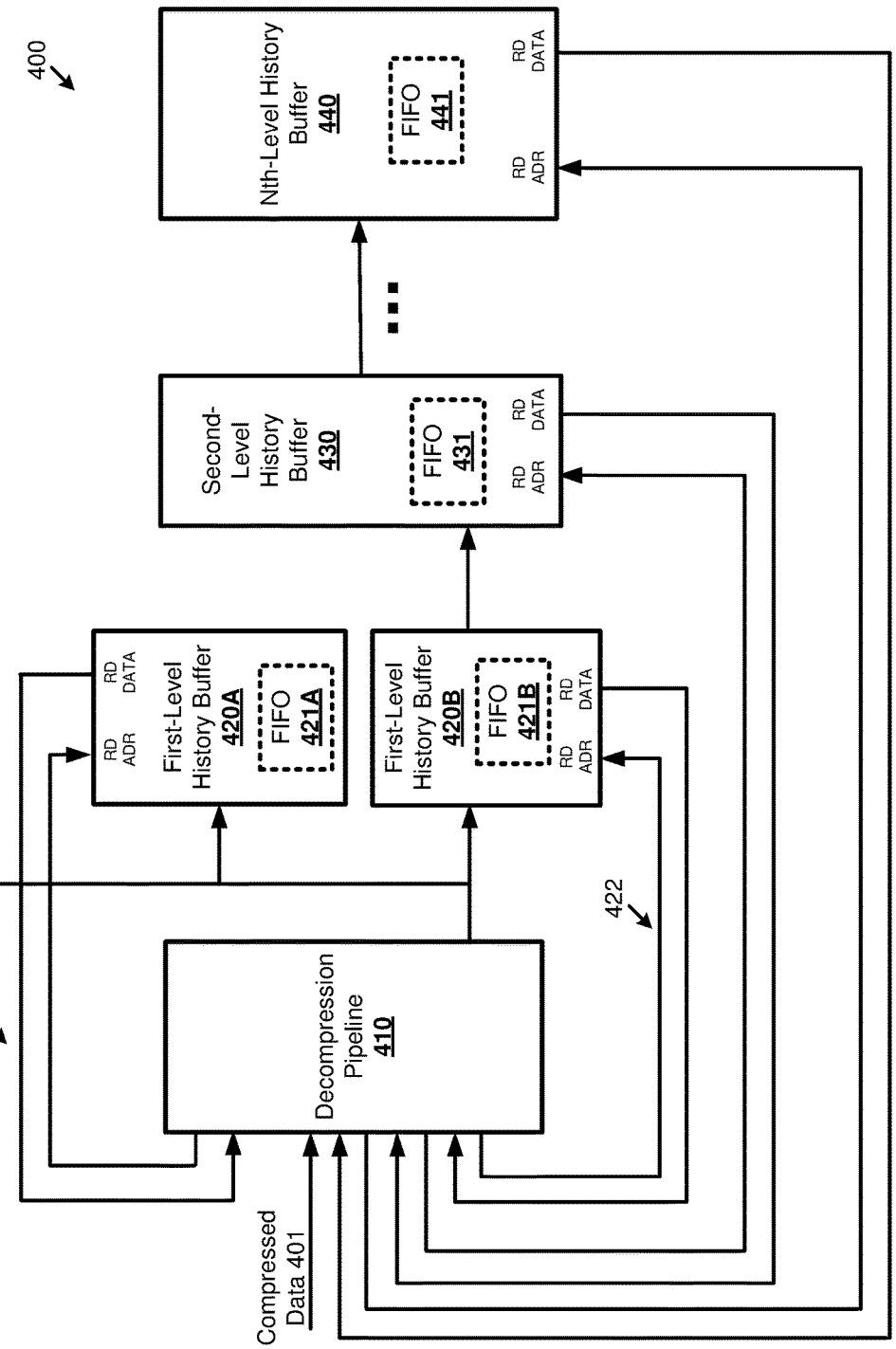
FIG. 4 is a system diagram showing an example of a system for performing decompression using cascaded history windows.

FIGS. 1-4 illustrate various aspects of an architecture for decompression using cascaded history windows. FIG. 1 illustrates a system diagram showing an example of a system for decompressing compressed data using cascaded history windows. The cascaded history windows can include a first-level history window and a second-level history window. As illustrated by FIG. 2, the cascaded history windows can be used to store different respective portions of a history of decompressed data as the compressed data is being decompressed. In particular, the first-level history window can be used to store more recent history and the second-level history window can be used to store less recent history. FIG. 3 illustrates an example of compressing a particular stream of information. FIG. 4 is a system diagram showing an example of a system for performing decompression using cascaded history buffers.

FIG. 1 is a system diagram showing an example of a system 100 for performing decompression using a decompression engine 110 and cascaded history windows 120 and 130. The decompression engine 110 can include hardware and/or software for performing decompression and interfacing with the cascaded history windows 120 and 130 and other electronic components (not shown). As one example, the decompression engine 110 can include circuits (e.g., computer hardware, such as hardwired digital logic circuits of an application-specific integrated circuit (ASIC) or programmed digital logic circuits of a field-programmable gate array (FPGA)) that are programmed or hard-coded to perform decompression functions and to interface with the cascaded history windows 120 and 130. As another example, the decompression engine 110 can include a central processing unit (CPU) or graphics processing unit (GPU) that is programmed with software to perform decompression functions and to interface with the cascaded history windows 120 and 130.

The decompression engine 110 can receive compressed data 101, decompress the compressed data 101, control read and/or write ports of the cascaded history windows 120 and 130, and transmit the decompressed data 111 to another electronic component (such as a memory). The compressed data 101 can be compressed using a lossless compression algorithm, such as a Lempel-Ziv algorithm. The compressed data 101 can include code words that reference a history of the data used to generate the compressed data 101. It should be noted that since lossless compression algorithms are invertible, the history of the data used to generate the compressed data 101 can be the same as the history of the data that is generated by the decompression engine 110. In other words, the original uncompressed data used to generate the compressed data 101 is the same as the final decompressed data 111 generated from the compressed data 101. The decompressed data 111 can be an output of the system 100 and can be written to the first-level history window 120 via a write-port of the first-level history window 120. As one example, the decompressed data 111 can be written to the first-level history window 120 in a first-in first-out (FIFO) order.

The first-level history window 120 can include storage for a recent history of the decompressed data 111. As one example, the first-level history window 120 can be implemented using flip-flops, latches, or a random access memory having multiple read ports. The decompressed data 111 can be organized into words, and individual words can be stored at different respective addresses of the first-level history window 120. Specifically, the first-level history buffer 120 can be logically organized as a two-dimensional array, where one dimension is the width of the word, and the other dimension is the number of addressable storage locations. The decompression engine 110 can store a given word from the decompressed data 111 in the first-level history buffer 120 using a write port of the first-level history window 120. A write port is an interface for storing data on a component (such as the first-level history buffer 120 component). As one example, a write port can include a set of signal lines (e.g., a bus) for providing an address to the first-level history window and a set of signal lines for providing data to the first-level history window and corresponding to the provided address. The address lines can be shared with the data lines, such as when the address and the data signals are time-multiplexed on the signal lines. Alternatively, the address lines can be different from the data lines. As one example, the first-level history buffer 120 can be architected for random-access writes, and a write port can receive the address of the storage location to write to and the data to be written at the specified storage location. The decompression engine 110 can manage the first-level history window 120 as a circular FIFO, where data is written to sequential addresses until the highest address is reached. When the highest address is reached, the next data can be written at the lowest address, thus forming a circular pattern. A tail pointer of the FIFO can be used to track where data is to be written into and a head pointer of the FIFO can be used to track where data is to be read from. As another example, the first-level history buffer 120 can be architected as a hardcoded FIFO having a single write input that is connected to the output 111 of the decompression engine 110. Specifically, the storage locations of the first-level history buffer 120 can be programmed or wired so that the output of one storage location is directly connected to an input of the next storage location. During steady-state operation, the first-level history window 120 can be filled with recent history of the decompressed data 111 and so the oldest word of the recent history can be output (such as via output 121) and then overwritten with newer decompressed data from the decompression engine 110. Thus, the first-level history window 120 can maintain a sliding window where only the most recent history (up to the size of the first-level history window 120) of the decompressed data 111 is maintained within the first-level history window 120.

The first-level history window 120 can include multiple (e.g., N, where N is greater than one) read ports 122 for accessing the information stored within the first-level history window 120 in a random access order. A read port is an interface for retrieving data stored on a component. As one example, a read port can include a set of signal lines (e.g., a bus) for providing an address to the first-level history window and a set of signal lines for receiving data from the first-level history window and corresponding to the provided address. The address lines can be shared with the data lines, such as when the address and the data signals are time-multiplexed on the signal lines. Alternatively, the address lines can be different from the data lines. As the number of read ports 122 are increased, an amount of storage of the first-level history window 120 may be reduced due to physical design constraints (e.g., the first-level history window 120 can become more congested as more read ports 122 are added). Thus, there can be trade-offs between a size and the number of read ports 122 of the first level history buffer 120. Each read port can provide an independent port for retrieving the information stored at a given storage location. Specifically, a given read port can receive an address corresponding to a particular storage location and the information stored at that storage location can be provided as an output of the read port. The different read ports 122 are independent, so a first read port can access a first address, and a second read port can access a second address that is different and not related to the first address. The multiple read ports 122 can be used to access the recent history of the decompressed data 111 so that the compressed data 101 can be decompressed in parallel. For example, the decompression can potentially be parallelized by a factor up to a total number of read ports 122 of the cascaded history windows 120 and 130.

The second-level history window 130 can include storage for a less recent history of the decompressed data 111. As one example, the second-level history window 130 can be implemented using a static or dynamic random access memory (SRAM or DRAM) having a single read port and a single write port. The decompression engine 110 can manage the second-level history window 130 as a circular FIFO. The output 121 of the first-level history window 120 can be used as an input of the second-level history window 130. Specifically, when the first-level history window 120 is full and new data arrives to be written in the first-level history window 120, the oldest word from the first-level history window 120 can be written to the second-level history window 130 in a FIFO order. As a specific example, data from the head of the FIFO of the first-level history window 120 can be written to a tail of the FIFO of the second-level history window 130 when new decompressed data is received at the first-level history window 120. In this manner, a history of the decompressed data 111 can be maintained within the history windows 120 and 130, where the first-level history window 120 contains more recent history and the second-level history window 130 contains less recent history. The decompression engine 110 can access the information stored within the second-level history window 130 using the read port 131 of the second-level history window 130. For example, the decompression engine 110 can provide a read address to the read port 131, and data stored at the location corresponding to the read address can be sent to the decompression engine 110 via an output of the second-level history window 130. While this example includes a single read port 131 for the second-level history window 130, it should be understood that more read ports are possible.

FIG. 2 illustrates an example of decompressing information using cascaded history windows. Specifically, compressed data 200 can be decompressed to generate decompressed data 220. It should be noted that while the relative sizes of the compressed data 200 and the decompressed data 220 indicate that the compressed data 200 is smaller than the decompressed data 220, the actual sizes are selected for illustration purposes only and are not to scale. When the compressed data 200 is compressed using a lossless compression algorithm, the decompressed data 220 is the same as the data used to generate the compressed data 200. The compressed data 200 can include information stored in memory, information stored in a file on a storage device, information within a network packet, or other information that can be represented within a computer system. The compressed data 200 can include multiple words that are ordered relative to each other. For example, the compressed data 200 can include a beginning word 201 and an ending word 202. The compressed data 200 can be streamed or transmitted to a decompression engine for decompression. Streaming the compressed data 200 can include presenting words of the compressed data 200 to the decompression engine in a sequential order starting with the beginning word 201 and ending with the ending word 202. The words can be presented to the decompression engine one word at a time or multiple words at a time. For example, the decompression can be parallelized by presenting multiple words to the decompression engine during a single cycle and/or by pipelining the decompression engine to process multiple words concurrently.

The data 210 illustrates an intermediate point in time during the processing of the compressed data 200 to show how the compressed data 200 can be transformed into the decompressed data 220. Specifically, a first portion of the compressed data 200 (e.g., the portion from word 201 to word 203) can be streamed to the decompression engine to generate the decompressed data 211. The earliest-generated decompressed data can be the word 217 and the most-recently generated decompressed data can be the word 218. A second portion of the compressed data 200 (e.g., the portion from word 203 to word 204) can be streamed to the decompression engine and can be in an intermediate state of processing, generating intermediate results 212. For example, the second portion of the compressed data 200 can be present in a pipeline of the decompression engine while the second portion is being processed. A third portion of the compressed data 200 (e.g., the portion from word 204 to word 202) can remain in the compressed state until the decompression engine is ready to perform decompression on the third portion. The compressed data 213 can be the same as the third portion of the compressed data.

The compressed data 200 can include references to data used to generate the compressed data 200. The references can refer to locations within a history window of the uncompressed data within a given distance. When the uncompressed data adheres to the principle of locality, more references will be to more recent history and fewer references will be to less recent history. The more recent history can refer to the decompressed or uncompressed data closer to a point of reference and the less recent history can refer to the decompressed or uncompressed data farther from a point of reference. As a specific example, the point of reference can be the word 218 and the history 214 can be more recent than the history 215. The more recent history 214 of the decompressed data 211 can be stored in a first-level history buffer and the less recent history 215 of the decompressed data 211 can be stored and a second-level history buffer. The history 216 of the decompressed data 211 can be an output of the decompression engine, but can be too remote to be stored in either the first-level history buffer or the second-level history buffer at this point of processing. As illustrated, the first-level history buffer containing the more recent history 214 can be smaller than the second-level history buffer containing the less recent history 215. By making first-level history buffer smaller than the second-level history buffer, the first-level history buffer can have more read ports than the second-level history buffer to potentially account for more references to the more recent history under the principle of locality. The compressed data 213 can be streamed to the decompression engine at a rate controlled by the decompression engine so that the compressed data 200 can be completely transformed into the decompressed data 220.

FIG. 3 illustrates an example of uncompressed information 300 and compressed information 320. The uncompressed information 300 can include the string, "ABC123DEF456ABCDEF7BCDE." The string 300 can be organized as sequential words beginning with the character "A" and ending with the character "E." The string 300 can be compressed using a dictionary coder. As one example, non-repetitive strings can be maintained as uncompressed information within the compressed information 320. Thus, the first time a sequence occurs within the uncompressed information 300, the sequence can be maintained in the decompressed information 320. As a specific example, there is no repetition in the beginning sequence 315 including the string "ABC123DEF456." Thus, the non-repeated sequence 315 can be maintained as the sequence 321 within the compressed information 320.

Repetitive sub-strings within the larger string that are larger than two words can be identified and encoded within the compressed information 320. Specifically, the repeated sequence 301 containing the string "ABC" matches the sequence 302. The repeated sequence 301 has a length of three words and matches the sequence 302 which is a distance 303 of 12 words away, where the distance 303 is measured from a beginning of the repeated sequence 301 to a beginning of the sequence 302. The repeated sequence 301 can be represented as a pair (12, 3) indicating the distance 303 and a length of the repeated sequence 301. The pair (12, 3) can be encoded as a code word 322 of the compressed information 320. The repeated sequence 305 containing the string "DEF" matches the sequence 306. The repeated sequence 305 has a length of three words and matches the sequence 306 which is a distance 307 of 9 words away. The repeated sequence 305 can be represented as a pair (9, 3) indicating the distance 307 and a length of the repeated sequence 305. The pair (9, 3) can be encoded as a code word 323 of the compressed information 320. The non-repeated sequence 316 containing the string "7" can be maintained as the sequence 324 within the compressed information 320. The repeated sequence 310 containing the string "BCDE" matches the sequence 311. The repeated sequence 310 has a length of four words and matches the sequence 311 which is a distance 312 of 6 words away. The repeated sequence 310 can be represented as a pair (6, 4) indicating the distance 312 and a length of the repeated sequence 310. The pair (6, 4) can be encoded as a code word 325 of the compressed information 320.

Compressed code words (e.g., 322, 323, and 325) can be distinguished from uncompressed information (e.g., 321 and 324) in various different ways. As one example, the compressed information 320 can include bits dedicated to distinguishing the type of information stored within the word. As a specific example, the word size for storing uncompressed information and/or code words can be eight bits, and a ninth bit can be included to distinguish between uncompressed information and code words. As another example, the compressed information 320 can be annotated with control information to distinguish between the uncompressed information and the code words. Specifically, the annotated compressed information 330 can include control words (e.g., 331, 333, and 335) interspersed with the compressed data (e.g., 332 and 334) to indicate which words of the compressed data are code words and which words of the compressed data are uncompressed information. For example, the different respective bits of the byte 331 can indicate which of the words within the eight-byte sequence 332 are code words and which of the words are uncompressed information.

During decompression of the compressed information 320, uncompressed portions (e.g., 315 and 316) within the compressed information 320 can be passed through the pipeline unchanged. Code words (e.g., 322, 323, and 325) representing compressed information can be decompressed by referencing the history of the decompressed information stored in the cascaded history buffers. Specifically, the code words can be replaced with the sequence that the code word replaced (e.g., the code word 322 can be replaced with "ABC").

FIG. 4 is a system diagram showing an example of a system 400 for performing decompression using cascaded history windows (e.g., 420A-B, 430, and 440). The system 400 includes N history buffers, where N is an integer greater than two. Lower-level history buffers (e.g., first-level history buffers 420A-B) can be smaller and can have more read ports than the higher-level history buffers (e.g., Nth-level history buffer 440). Each of the history buffers can store a portion of the history that is generated by the decompression pipeline 410. For example, the first-level history buffers 420A-B can store the most recent history generated by the decompression pipeline 410 and the higher level history buffers can store less recent history. Specifically, the history from the first-level history buffers 420A-B can cascade into the second-level history buffer 430 (e.g., the history can flow from an output of FIFO 421B to an input of FIFO 431), which can cascade into a third level history buffer (not shown), and so forth until the Nth-level history buffer 440 receives the least recent history (e.g., at an input of FIFO 441). Thus, the decompression pipeline 410 can have greater access to more recent history by using the additional read ports provided by the lower-level history buffers while still having access to less recent history that is stored in the higher level history buffers. The overall size of the history buffer available to the decompression pipeline 410 can be a sum of the storage capacity of the different levels of history buffers. This arrangement can potentially allow for greater compression of the compressed data 401 compared to using a uniform buffer with multiple read ports since the Nth-level history buffer 440 having a single read port can be sized larger than a uniform history buffer. Additionally, more parallelization can occur because the first-level history buffers 420A-B can provide more read ports than a larger uniform buffer.

The decompression pipeline 410 can include a pipelined architecture. In a pipelined architecture, a given task can be broken up into multiple subtasks that are executed by different respective pipeline stages. For the decompression pipeline 410, the given task can be decompressing a given word of the compressed data 401. As one example, multiple words of the compressed data 401 can be decompressed concurrently by performing different subtasks of the decompression on the different words of the compressed data 401. As another example, multiple words of the compressed data 401 can be decompressed concurrently by adding parallel functional units (e.g., decompression pipelines) to perform decompression on the different words in parallel. The pipeline can perform operations at a rate determined by a clock that is used to time the operations occurring within the pipeline. Thus, each subtask can perform work during one clock cycle. The decompression pipeline 410 can include pipeline stages for performing the different subtasks associated with decompressing the compressed data 401. As one example, a first pipeline stage can determine whether a particular word of the compressed data 401 is an uncompressed word, a control word, or a code word.

A second pipeline stage can calculate a location (e.g., a specific history buffer and an address within the history buffer) of history data associated with a reference of the control word. For example, the control word can provide a distance to a sequence within the history and a length of the sequence. The second pipeline stage can determine where the first word of the sequence is located, and can step through the additional words of the sequence during subsequent clock cycles. Depending on the distance to the beginning of the sequence, the values of the compressed data 401, and the progress of the decompression pipeline 410, some or all of the referenced sequence may be in the process of being generated or may be in one or more of the different history buffers. The second pipeline stage can detect when the referenced word of the sequence is not yet generated. This can be referred to as hazard detection. When a hazard is detected (e.g., when the referenced word of the sequence is not yet generated), the second pipeline stage can stall and wait for the word of the sequence to be generated before continuing. Stalling the pipeline can include stopping decompression of the words of the compressed data 401 following the compressed word causing the stall. When the referenced word of the sequence has been generated, the history buffer storing the referenced sequence can be determined, and an address within the history buffer corresponding to the referenced word of the sequence can be calculated.

A third pipeline stage can issue a read request to the targeted history buffer so that the history data (e.g., the referenced word of the sequence) can be returned to the decompression engine 410. Issuing the read request can include providing the address calculated by the second pipeline stage to a read port of the targeted history buffer. Control logic within the decompression pipeline 410 can detect when parallel functional units request reads to the same history buffers and can arbitrate between the different functional units so that the read ports of the different history buffers are not oversubscribed.

A fourth pipeline stage can output decompressed data 411 from the decompression pipeline 410. The decompressed data 411 can be transmitted to other system components (not shown) and to the first-level history buffers 420A-B. The fourth pipeline stage can also output an address or addresses for writing the particular word of the decompressed data 411 within the first-level history buffers 420A-B. As described above, the decompression pipeline 410 can manage the information stored in the first-level history buffers 420A-B as a FIFO (e.g., FIFOs 421A-B), and the write address can correspond to the tail of the FIFO. Multiple words can be written to the first-level history buffers 420A-B during the same cycle. For example, the pipeline or pipelines can process multiple words in parallel, and a variable-sized group of decompressed words can be written to the first-level history buffers 420A-B. As a specific example, one word can be written after processing a compressed code word and up to eight words can be written after processing an uncompressed sequence of the compressed data. The size of the data to be written can be controlled by using different write enables for each of the respective words within a group of words starting at the write address, for example. While four pipeline stages are described, it should be understood that modifications to the illustrated microarchitecture are possible. For example, stages can be added or removed, and the subtasks of the decompression function can be divided in different ways.

The different history buffers can be organized differently to provide different characteristics for each of the buffers. For example, the lower-level history buffers can be organized differently than the higher level history buffers to provide more read ports at the lower levels. Additionally, the lower-level history buffers can be implemented with different circuitry than the higher level history buffers so that the lower-level history buffers can provide read data with less latency and the higher level history buffers may provide read data with more latency. As one example, the first-level history buffers 420A-B can be architected to potentially provide a higher number of read ports with less congestion than a uniform first-level history buffer. Specifically, the first-level history buffer 420A can provide a first bank of random access storage and the first-level history buffer 420B can provide a second bank of random access storage. The different banks of random access storage can be written in parallel with the same decompressed data 411 from the decompression pipeline 410. Thus, both of the first-level history buffers 420A-B can include the same information at the same addresses within the different banks. However, the different buffers 420A-B can include different respective read ports (e.g., read ports 422 and 423) that are independently addressable from each other. Thus, different history data can be retrieved from the first-level history buffer 420A and the first-level history buffer 420B.

The different history buffers can be implemented with different circuits to provide different characteristics for each of the buffers. As one example, the storage elements of the first-level history buffers 420A-B can be implemented with flip-flops or latches. For example, using a flip-flop design may enable more read ports to be provided compared to using a hard macro or regular memory array structure. As another example, the storage elements of the second-level history buffer 430 can be SRAM cells, such as six-transistor (6T), 4T, 8T, or 10T cells. SRAM can potentially provide higher density storage but fewer read ports. As another example, the storage elements of the Nth-level history buffer 440 can be DRAM cells (e.g., 1T cells). DRAM can potentially provide even higher density than SRAM, but with additional complexity associated with refreshing the DRAM cell, and additional latency associated with accessing the DRAM cell.

Example Methods for Decompression Using Cascaded History Windows

Figure 5:
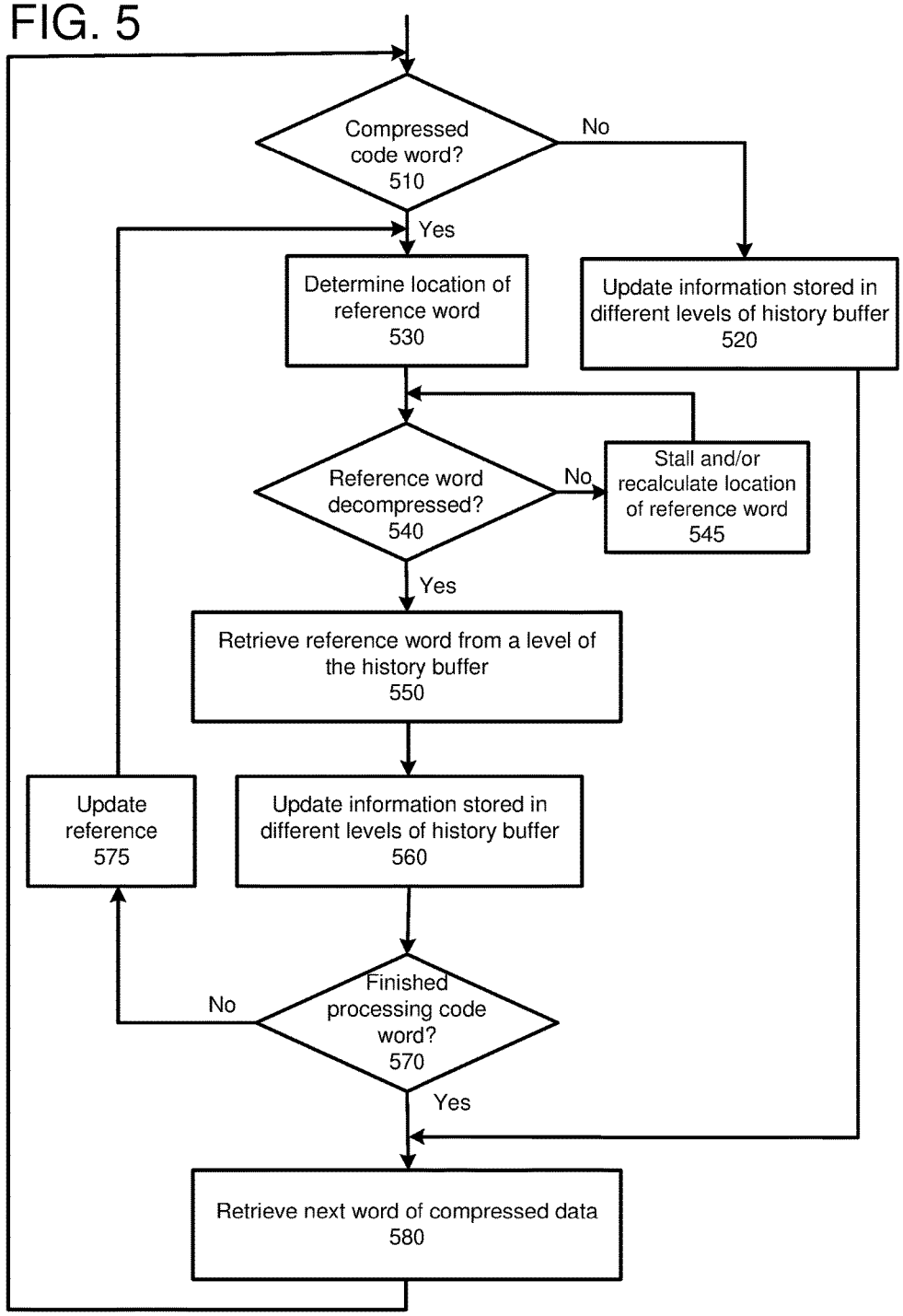
FIG. 5 is a flow diagram of an example method of processing a code-word of compressed data.

FIG. 5 is a flow diagram of an example method 500 of processing a particular word of compressed data. As one example, the method 500 can be implemented using a decompression engine architected as described above with reference to FIGS. 1-4. In particular, the method 500 can be implemented using a decompression pipeline of a decompression engine.

At 510, it can be determined whether the particular word of compressed data is a code word. For example, the words of the compressed data can be uncompressed words or code words. If the particular word of the compressed data is not a code word (e.g., it is an uncompressed word), the method 500 can continue at 520. However, if the particular word of the compressed data is a code word, the method 500 can continue at 530.

At 520, the particular word of compressed data is an uncompressed word, and information stored in the different levels of the history buffer can be updated. For example, different portions of a history of decompressed data can be stored in the different respective levels of the history buffer. A first-level history buffer can store the most recent history, a second-level history buffer can store less recent history, and so forth. The different levels of the history buffers can be organized so that the history data cascades through the different levels of the buffers. As one example, decompressed data (such as the uncompressed data of the particular word) can be written into the first-level history buffer in a FIFO order. When the FIFO is full and new data is to be written into the first-level history buffer, the oldest data in the FIFO can be written into the second-level history buffer. The second-level history buffer can also be organized as a FIFO, and the oldest data evicted from the first-level history buffer can be written into a tail of the FIFO of the second-level history buffer. If more than two levels of history buffers are present, the oldest data from the second-level history buffer can be written into a tail of a FIFO of the next-level history buffer, and so forth. In the highest-level history buffer, the oldest data within the buffer can be overwritten with the newest data being written in the buffer.

At 530, a location of a reference word can be determined. For example, the particular code word can include a pair comprising a distance to a sequence within the history and a length of the sequence. Initially, the reference word can be a beginning of the sequence within the history. As processing of the particular code word continues, the reference word can be a later word within the sequence. The reference word can be present in one of the levels of the history buffer or the reference word can refer to a section of decompressed data that is still being processed (such as by a later stage of the decompression pipeline). If the reference word is present in one of the levels of the history buffer, the particular level of the history buffer can be identified and an address of the reference word within the particular level of the history buffer can be calculated. As a specific example, the distance to the sequence can be greater than a size of the first-level history buffer and the less than a sum of the sizes of the first-level history buffer and the second-level history buffer. An offset of the reference word can be the size of the first-level history buffer subtracted from the distance. The address of the reference word within the second-level history buffer can be the offset subtracted from a tail address of the second-level history buffer, and any adjustments to account for pipeline delays and earlier code words that are currently being processed.

At 540, it can be determined if the reference word is decompressed. The reference word will be decompressed when the reference word has been output by the decompression pipeline. If the reference word has not been output (e.g., a code word generating the reference word is still being processed), the method 500 can continue at 545. However, if the reference word has been decompressed the method 500 can continue at 550.

At 545, the decompression pipeline can stall and/or recalculate the location of the reference word. For example, the decompression pipeline can wait for the reference word to be decompressed. The address of the reference word may be recalculated based on progress of the processing of earlier code words. The decompression pipeline can continue to wait until the reference word is decompressed.

At 550, the reference word can be retrieved from a level of the history buffer. For example, the decompression pipeline can use a read port of the particular level of the history buffer storing the reference word to retrieve the reference word. Specifically, the decompression pipeline can provide the read address of the reference word along with control information to the particular level of the history buffer. The control information can include a read enable and/or other various control signals. The retrieved reference word can be output as part of the decompressed data generated by the decompression pipeline.

At 560, the information stored in the different levels of the history buffer can be updated. For example, the retrieved reference word from 550 can be output as decompressed data and written to the first-level history buffer in a FIFO order. The different levels of the history buffers can be updated in a manner similar to the description at 520, where the different portions of the history can cascade through the different levels of the history buffers.

At 570, it can be determined whether processing of the particular code word is complete. For example, processing can be complete when the entire sequence referenced within the particular code word has been retrieved from the history buffers. When the entire referenced sequence has been retrieved, the processing can be complete and the method 500 can continue at 580. However, when only a portion of the referenced sequence has been retrieved from the history buffers, the processing can continue at 575.

At 575, the reference word associated with the particular code word can be updated. For example, an offset counter can be maintained to track the current reference associated with the particular code word. In particular, the offset counter can be set to zero when beginning processing of the particular code word to indicate that the reference word is the beginning of the sequence referenced by the particular code word. As each word of the sequence is processed, the offset counter can be incremented to indicate that the next word in the sequence will be the new reference word to be processed. In this manner, each of the words of the referenced sequence can be retrieved from the history buffers so that the compressed code word can be decompressed. After the reference word associated with the particular code word is updated, the method 500 can continue at 510.

At 580, the next word of the compressed data can be retrieved so that the next word can be processed. The next word can be processed in a similar manner to the particular code word. For example, the method 500 can continue at 510 using the next word as the object of processing.

Figure 6:
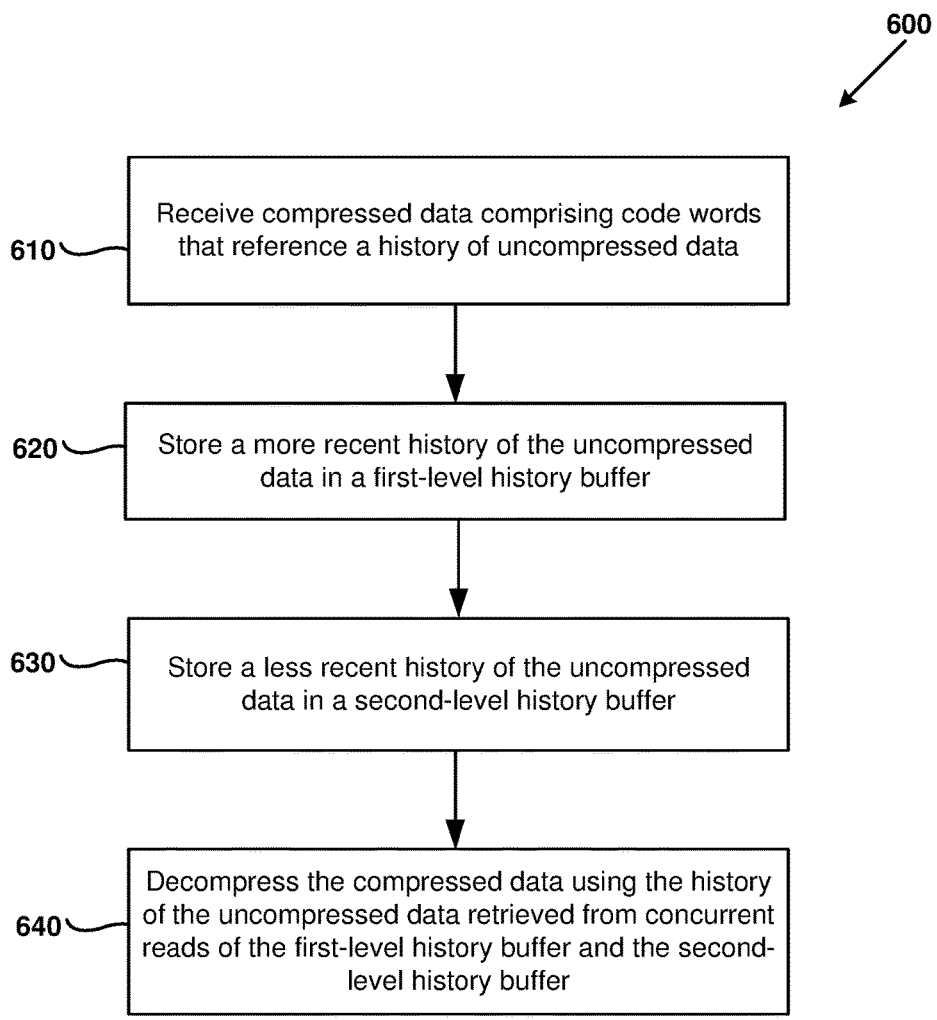
FIG. 6 is a flow diagram of an example method of decompression using cascaded history windows.

FIG. 6 is a flow diagram of an example method 600 of decompression using cascaded history windows. As one example, the method 600 can be implemented using a decompression engine architected as described above with reference to FIGS. 1-4. In particular, the method 600 can be implemented using a decompression pipeline of a decompression engine.

At 610, compressed data can be received. The compressed data can be compressed using a lossless compression algorithm, such as a dictionary coder or a Lempel-Ziv algorithm. The compressed data can include uncompressed words and code words that reference a history of uncompressed data. It should be noted that since lossless compression algorithms are invertible, a history of the uncompressed data used to generate the compressed data is the same as the history of the data that is generated from the compressed data (e.g., by using a decompression algorithm). In other words, the original uncompressed data used to generate compressed data is the same as the final decompressed data that is generated from the compressed data. As one example, each code word of the compressed data can include a reference to a sequence in the uncompressed data. The reference can include a distance to the sequence from a current code word and a length of the sequence. The compressed data can be data that is extracted from a network packet, data that is read from a file stored on a storage device, or other data that is streamed to the decompression engine.

At 620, a more recent history of the uncompressed data can be stored in a first-level history buffer. Storing the more recent history of the uncompressed data in the first-level history buffer can include writing the decompressed data to the first-level history buffer in a first-in first-out order. The first-level history buffer can be implemented and organized in various different ways. As one example, the first-level history buffer can include multiple parallel banks of storage elements, and storing the more recent history of the decompressed data in the first-level history buffer can include replicating the decompressed data in the multiple banks of the first-level history buffer. The different banks can have different respective read ports so that different data can be concurrently read from the different respective banks. The storage elements can be implemented using latches or flip-flops, for example. The first-level history buffer can include multiple read ports for performing multiple concurrent reads to different respective storage locations of the first-level history buffer. For example, the decompression engine can control the read ports using address and control information to access the decompressed data stored in the first-level history buffer.

At 630, a less recent history of the uncompressed data can be stored in a second-level history buffer. Storing the less recent history of the uncompressed data in the second-level history buffer can include retrieving the oldest decompressed data from the more recent history of the decompressed data in the first-level history buffer and writing the retrieved oldest decompressed data to the second-level history buffer in a first-in first-out order. The second-level history buffer can be implemented and organized in various different ways. As one example, the second-level history buffer can include a regular memory array, such as an SRAM. The SRAM can provide for random access reads and writes using read ports and write ports, respectively. For example, the decompression engine can control the read ports using address and control information to access the decompressed data stored in the second-level history buffer. The second-level history buffer can be larger than the first-level history buffer and the second-level history buffer can have fewer read ports than the first-level history buffer.

At 640, the compressed data can be decompressed using the history of the uncompressed data retrieved from concurrent reads of the first-level history buffer and the second-level history buffer. Decompressing the compressed data can include determining whether a particular word of the compressed data is a compressed code word or an uncompressed data word. For example, a bit of each word of the compressed data can be used to determine the type (e.g., compressed code word or an uncompressed data word) of the word. As another example, control words can be interspersed within the compressed data (such as at regular intervals), and the control words can be used to determine the type of the word. Decompressing the compressed data can include determining whether a reference of a particular compressed code word of the compressed data refers to data that is stored in the first-level history buffer or the second-level history buffer. Decompressing the compressed data can include determining a location within the first-level history buffer or the second-level history buffer pointed to by a reference of a particular compressed code word of the compressed data.

Example Computing Environment

Figure 7:
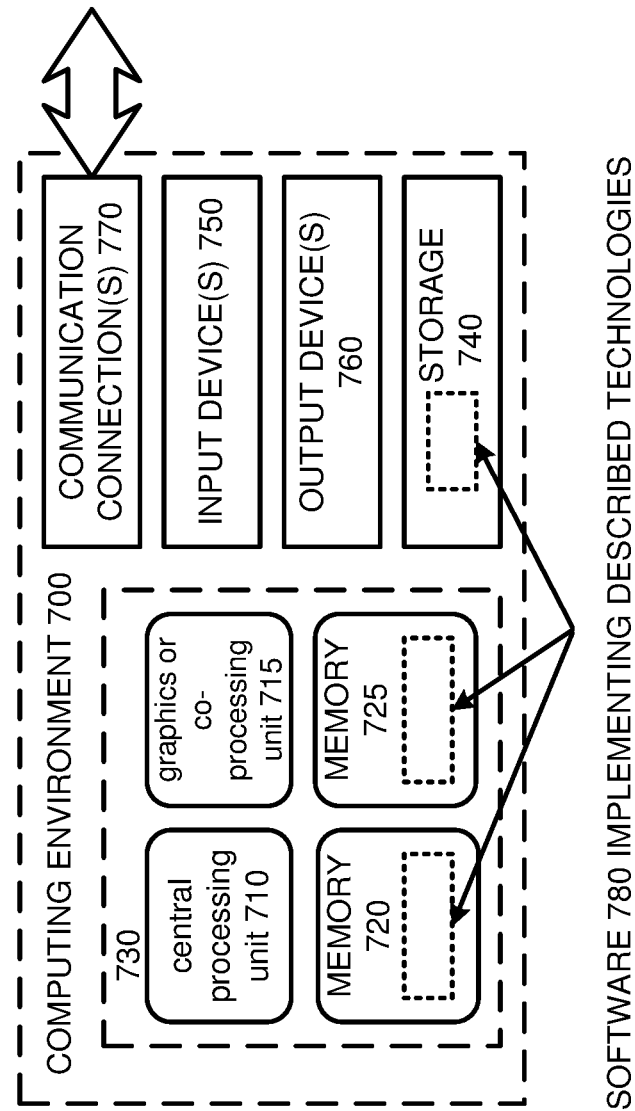
FIG. 7 depicts a generalized example of a suitable computing environment in which the described innovations may be implemented.

FIG. 7 depicts a generalized example of a suitable computing environment 700 in which the described innovations may be implemented. The computing environment 700 is not intended to suggest any limitation as to scope of use or functionality, as the innovations may be implemented in diverse general-purpose or special-purpose computing systems. For example, the computing environment 700 can be any of a variety of computing devices (e.g., desktop computer, laptop computer, server computer, tablet computer, etc.).

With reference to FIG. 7, the computing environment 700 includes one or more processing units 710, 715 and memory 720, 725. In FIG. 7, this basic configuration 730 is included within a dashed line. The processing units 710, 715 execute computer-executable instructions. A processing unit can be a general-purpose central processing unit (CPU), a processor in an application-specific integrated circuit (ASIC) or any other type of processor. In a multi-processing system, multiple processing units execute computer-executable instructions to increase processing power. For example, FIG. 7 shows a central processing unit 710 as well as a graphics processing unit or co-processing unit 715. The tangible memory 720, 725 may be volatile memory (e.g., registers, cache, RAM), non-volatile memory (e.g., ROM, EEPROM, flash memory, etc.), or some combination of the two, accessible by the processing unit(s). The memory 720, 725 stores software 780 implementing one or more innovations described herein, in the form of computer-executable instructions suitable for execution by the processing unit(s).

A computing system may have additional features. For example, the computing environment 700 includes storage 740, one or more input devices 750, one or more output devices 760, and one or more communication connections 770. An interconnection mechanism (not shown) such as a bus, controller, or network interconnects the components of the computing environment 700. Typically, operating system software (not shown) provides an operating environment for other software executing in the computing environment 700, and coordinates activities of the components of the computing environment 700.

The tangible storage 740 may be removable or non-removable, and includes magnetic disks, magnetic tapes or cassettes, CD-ROMs, DVDs, or any other medium which can be used to store information in a non-transitory way and which can be accessed within the computing environment 700. The storage 740 stores instructions for the software 780 implementing one or more innovations described herein.

The input device(s) 750 may be a touch input device such as a keyboard, mouse, pen, or trackball, a voice input device, a scanning device, or another device that provides input to the computing environment 700. The output device(s) 760 may be a display, printer, speaker, CD-writer, or another device that provides output from the computing environment 700.

The communication connection(s) 770 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in Verilog, VHDL, C++, Java, Perl, or any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only examples of the invention and should not be taken as limiting the scope of the invention. We therefore claim as our invention all that comes within the scope of these claims.

What is claimed is:

1. An apparatus comprising:
a decompression engine configured to decompress a compressed data stream, the compressed data stream comprising code words with references to a history of an uncompressed data stream used to generate the compressed data stream;
a first-level history buffer in communication with the decompression engine and configured to store decompressed data from the decompression engine in a first-in first-out order for storage in the first-level history buffer; and
a second-level history buffer in communication with the decompression engine and the first-level history buffer, the second-level history buffer configured to store decompressed data from the first-level history buffer in a first-in first-out order for storage in the second-level history buffer; and
wherein the decompression engine is configured to decompress the compressed data associated with a plurality of code words of the compressed data stream using decompressed data received by concurrently reading from the first-level history buffer and the second-level history buffer using a random access order.

2. The apparatus of claim 1, wherein the decompression engine is configured to decompress a compressed data stream that is compressed using a dictionary coder compression algorithm.

3. The apparatus of claim 1, wherein the decompression engine is configured to decompress a compressed data stream that is compressed using Lempel-Ziv compression.

4. The apparatus of claim 1, wherein the first-level history buffer comprises a plurality of banks, and copies of the decompressed data from the decompression engine are written in parallel to respective banks of the first-level history buffer.

5. The apparatus of claim 4, wherein respective banks of the first-level history buffer are independently addressable by the decompression engine when reading the first-level history buffer.

6. The apparatus of claim 1, further comprising:
a third-level history buffer in communication with the decompression engine and the second-level history buffer, the third-level history buffer configured to receive decompressed data from the second-level history buffer in a first-in first-out order for storage in the third-level history buffer.

7. An apparatus comprising:
a decompression engine configured to receive compressed data comprising code words that reference a history of uncompressed data and to decompress the compressed data using a history of the uncompressed data;
a first-level history buffer configured to store a more recent history of the uncompressed data; and
a second-level history buffer configured to store a less recent history of the uncompressed data; and
wherein the decompression engine is configured to decompress the compressed data by determining a location within the first-level history buffer or the second-level history buffer pointed to by a reference of a particular compressed code word of the compressed data.

8. The apparatus of claim 7, wherein the first-level history buffer is configured to store the more recent history of the uncompressed data in a first-in first-out order.

9. The apparatus of claim 8, wherein the second-level history buffer is configured to store the less recent history of the uncompressed data by retrieving the oldest decompressed data from the more recent history of the decompressed data in the first-level history buffer and writing the retrieved oldest decompressed data to the second-level history buffer in a first-in first-out order.

10. The apparatus of claim 7, wherein the first-level history buffer comprises multiple banks, and storing the more recent history of the uncompressed data in the first-level history buffer comprises replicating the decompressed data in the multiple banks of the first-level history buffer, wherein the different banks have different respective read ports.

11. The apparatus of claim 7, wherein the first-level history buffer is a flip-flop-based buffer and the second-level history buffer is a static random-access memory-based buffer.

12. The apparatus of claim 7, wherein the first-level history buffer comprises a plurality of read ports for performing a plurality of concurrent reads to different respective storage locations of the first-level history buffer.

13. The apparatus of claim 12, wherein the first-level history buffer has more read ports than the second-level history buffer.

14. The apparatus of claim 7, wherein decompressing the compressed data comprises determining whether a particular word of the compressed data is a compressed code word or an uncompressed data word.

15. The apparatus of claim 7, wherein the second-level history buffer comprises more storage locations for storing uncompressed data than the first-level history buffer.

16. An apparatus comprising:
a decompression pipeline configured to decompress compressed data comprising code words that reference a history of decompressed data generated from the compressed data;
a first-level history buffer configured to store a more recent history of the decompressed data received from the decompression pipeline; and
a second-level history buffer configured to store a less recent history of the decompressed data received from the first-level history buffer; and
wherein the decompression pipeline comprises a first stage configured to determine whether a particular word of the compressed data is a code word and a second stage configured to determine a location within the first-level history buffer or the second-level history buffer pointed to by a reference of the code word.

17. The apparatus of claim 16, wherein the first-level history buffer comprises a first-in first-out buffer, and the decompressed data from the decompression engine is used as an input of the first-in first-out buffer of the first-level history buffer.

18. The apparatus of claim 16, wherein the second-level history buffer comprises a first-in first-out buffer, and an output from the first-in first-out buffer of the first-level history buffer is used as an input of the first-in first-out buffer of the second-level history buffer.

19. The apparatus of claim 16, wherein the second stage of the decompression pipeline is further configured to stall when the location pointed to by the reference of the code word is in the process of being generated.

20. The apparatus of claim 16, wherein the decompression pipeline is further configured to determine whether a reference of a particular code word of the compressed data refers to data that is being decompressed by the decompression pipeline.

* * * * *